United States Patent
Kubota et al.

(10) Patent No.: US 8,324,662 B2
(45) Date of Patent: Dec. 4, 2012

(54) SEMICONDUCTOR DEVICE

(75) Inventors: Yoshitaka Kubota, Kanagawa (JP); Hiromichi Takaoka, Kanagawa (JP); Hiroshi Tsuda, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/591,727

(22) Filed: Nov. 30, 2009

(65) Prior Publication Data

US 2010/0133650 A1   Jun. 3, 2010

(30) Foreign Application Priority Data

Dec. 2, 2008   (JP) ................. 2008/307934

(51) Int. Cl.
*H01L 23/52* (2006.01)
(52) U.S. Cl. . 257/209; 257/528; 257/665; 257/E23.149; 257/E21.592; 438/215; 438/281; 438/333; 438/467; 438/601
(58) Field of Classification Search .............. 257/529, 257/209, 528, 665, E23.149, E21.592; 438/215, 438/281, 333, 467, 601
See application file for complete search history.

(56) References Cited

U.S. PATENT DOCUMENTS

| | | | | |
|---|---|---|---|---|
| 6,667,533 | B2 * | 12/2003 | Daubenspeck et al. | 257/529 |
| 7,378,718 | B2 * | 5/2008 | Tsutsui | 257/529 |
| 7,635,907 | B2 * | 12/2009 | Ueda | 257/529 |
| 2007/0090486 | A1 * | 4/2007 | Otsuka et al. | 257/529 |
| 2007/0262414 | A1 | 11/2007 | Ueda | |

FOREIGN PATENT DOCUMENTS

JP   2007-305693   11/2007

* cited by examiner

*Primary Examiner* — Steven Loke
*Assistant Examiner* — Cuong Nguyen
(74) *Attorney, Agent, or Firm* — McGinn IP Law Group, PLLC

(57) ABSTRACT

A semiconductor device includes an electric fuse formed on a substrate. The electric fuse includes: a first interconnect formed on one end side thereof; a second interconnect formed in a layer different from a layer in which the first interconnect is formed; a first via provided in contact with the first interconnect and the second interconnect to connect those interconnects; a third interconnect formed on another end side thereof, the third interconnect being formed in the same layer in which the first interconnect is formed, as being separated from the first interconnect; and a second via provided in contact with the third interconnect and the second interconnect to connect those interconnects, the second via being lower in resistance than the first via. The electric fuse is disconnected by a flowing-out portion to be formed of a conductive material forming the electric fuse which flows outwardly during disconnection.

13 Claims, 8 Drawing Sheets

RELATED ART

SEMICONDUCTOR DEVICE

BACKGROUND OF THE INVENTION

1. Field of the Invention

The present invention relates to a semiconductor device including an electric fuse.

2. Description of the Related Art

In recent years, there has been proposed a novel method of disconnecting an electric fuse, which is called a crack assist type method. In this method, the structure of the electric fuse, how to apply a voltage to the electric fuse, and the like are controlled, to thereby forcibly cause a conductive material forming the electric fuse as a part thereof to flow outwardly, that is, into an insulating film located around the conductive material, during disconnection of the electric fuse. As a result, a movement and supply balance among the materials is lost. In this manner, a large disconnection point is formed in another part. Accordingly, the possibility that the disconnected electric fuse is connected again may be greatly reduced, and the disconnection state may be satisfactorily maintained (see, for example, JP 2007-305693 A).

FIG. 5 is a plan view illustrating a structure of a semiconductor device 50 including an electric fuse 10 that is similar to the electric fuse described in JP 2007-305693 A. The electric fuse 10 includes a terminal 14 and a terminal 24, an upper layer fuse interconnect 12 connected to the terminal 14, a lower layer fuse interconnect 22 connected to the terminal 24, and a via 30 that connects the upper layer fuse interconnect 12 and the lower layer fuse interconnect 22.

FIGS. 6A to 6C are cross-sectional views taken along the line C-C' of FIG. 5. The semiconductor device 50 has a structure in which an interlayer insulating film 202, an etching stopper film 204, an interlayer insulating film 206, and an interlayer insulating film 210 are laminated on a substrate (not shown) in the stated order. The terminal 24 and the lower layer fuse interconnect 22 are formed in the interlayer insulating film 202, whereas the via 30, the upper layer fuse interconnect 12, and the terminal 14 are formed in the interlayer insulating film 206.

In the electric fuse 10 having the above-mentioned structure, when a voltage is applied between the terminal 14 and the terminal 24, a current is caused to flow in a direction from the lower layer fuse interconnect 22 to the upper layer fuse interconnect 12 (FIG. 6A). As a result, the via 30 and the upper layer fuse interconnect 12 are heated. Further, the conductive material such as copper, which forms each of the via 30 and the upper layer fuse interconnect 12, expands. A via diameter of the via 30 also expands to be larger than an original via diameter thereof (FIG. 6B). After that, when the expansion of the upper layer fuse interconnect 12 advances to a certain degree, a crack occurs in the interlayer insulating film 206 located around the upper layer fuse interconnect 12. As a result, the conductive material of the upper layer fuse interconnect 12 flows into the interlayer insulating film 206, to thereby form a flowing-out portion 70 (FIG. 6C). In a case where the electric fuse 10 is normally disconnected, the conductive material of the via 30 also moves along with the flowing-out of the conductive material of the upper layer fuse interconnect 12, with the result that a disconnection point is formed in the via 30.

Incidentally, the inventor of the present invention found that the following problems arise when the electric fuse having the structure as described in JP 2007-305693 A is to be disconnected by the crack assist type method.

FIGS. 7A to 7C are cross-sectional views illustrating the upper layer fuse interconnect 12, the via 30, and the lower layer fuse interconnect 22 included in the electric fuse 10 of FIG. 5. In the electric fuse 10 having the structure as illustrated in FIG. 5, when a voltage is applied between the terminal 14 and the terminal 24, more heat is generated in a portion between the terminal 14 and the terminal 24, the portion being higher in resistance, and thus the temperature of that portion becomes the highest in the electric fuse 10. Further, the terminal 14 and the terminal 24, each having a large area, function as heat sinks. Therefore, a point at which the temperature becomes the highest in the electric fuse 10 during the disconnection of the electric fuse 10 is somewhere around the portion having a large heat generation amount, which is away from the terminal 14 and the terminal 24. Further, in disconnecting the electric fuse 10, a position at which the flowing-out portion 70 is formed may vary, depending on areas or the like of the respective structural components.

In order that the flowing-out portion 70 is formed in the upper layer fuse interconnect 12 and that the disconnection point is formed in the via 30, a width and a length of each of the upper layer fuse interconnect 12 and the lower layer fuse interconnect 22 are appropriately adjusted. As a result, a temperature near the connection point of the upper layer fuse interconnect 12 with the via 30 may be set to be the highest in the electric fuse 10 (FIG. 7A). However, during a manufacture of the semiconductor device 50, there is a case, for example, as illustrated in FIG. 7B, in which a film thickness of the upper layer fuse interconnect 12 reduces from a preset value d1 of FIG. 7A to a value d2 of FIG. 7B (d1>d2), due to manufacturing fluctuations such as fluctuations in film formation or polishing. In such a case, a resistance of the upper layer fuse interconnect 12 changes to become higher, with the result that the point at which the temperature becomes the highest during the disconnection shifts to a center part of the upper layer fuse interconnect 12, which is away from the via 30.

As described above, when the point at which the temperature becomes the highest during the disconnection is shifted away from the via 30 to excessively approach the center part of the upper layer fuse interconnect 12, the via 30 is not sufficiently heated. As a result, a disconnection failure that the via 30 is not disconnected occurs. Description is given with reference to FIGS. 8A and 8B. FIGS. 8A and 8B are cross-sectional views taken along the line C-C' of FIG. 5, and illustrate steps subsequent to the steps of FIGS. 6A to 6C during the disconnection of the electric fuse 10. When the upper layer fuse interconnect 12 flows out before the conductive material that forms the via 30 is sufficiently heated to be melted enough to be movable, a void is formed in the upper layer fuse interconnect 12, and then a disconnection point 72 is formed in the upper layer fuse interconnect 12 (FIG. 8A). In this case, the conductive material of the via 30 does not move. After that, the conductive material continues to thermally contract until the temperature thereof reaches room temperature, and then solidifies while leaving the disconnection point 72 above the via 30 and in the upper layer fuse interconnect 12 (FIG. 8B). However, in the structure described above in which the disconnection point 72 is formed in the upper layer fuse interconnect 12, there is a fear that the electric fuse 10 is reconnected in a case where the conductive material coagulates and then deforms due to thermal history thereof in the following assembly process or the like of the semiconductor device 50 or in actual use of the semiconductor device 50 under high temperature.

Further, there may be another case, for example, as illustrated in FIG. 7C, in which the film thickness of the upper layer fuse interconnect 12 increases from the preset value d1 of FIG. 7A to a value d3 of FIG. 7C (d3>d1). In such a case, the resistance of the upper layer fuse interconnect 12 changes to become lower, with the result that the point at which the temperature becomes the highest during the disconnection shifts to a bottom part of the via 30. However, when the point at which the temperature becomes the highest during the disconnection approaches the bottom part of the via 30 as described above, the conductive material flows out also from the bottom part of the via 30, and may be short-circuited with the conductive material that has flowed out from the upper layer fuse interconnect 12.

SUMMARY

According to the present invention, there is provided a semiconductor device including:
a substrate; and
an electric fuse formed on the substrate,
the electric fuse including:
a first interconnect formed on one end side of the electric fuse;
a second interconnect formed in a layer different from a layer in which the first interconnect is formed;
a first via portion provided in contact with the first interconnect and the second interconnect to connect the first interconnect and the second interconnect;
a third interconnect formed on another end side of the electric fuse, the third interconnect being formed in the same layer in which the first interconnect is formed, as being separated from the first interconnect; and
a second via portion provided in contact with the third interconnect and the second interconnect to connect the third interconnect and the second interconnect, the second via portion being lower in resistance than the first via portion,
in which the electric fuse is disconnected by a flowing-out portion to be formed of a conductive material forming the electric fuse which flows outwardly during disconnection.

With this structure, even when a film thickness of the first interconnect, which is designed such that the flowing-out portion is formed during the disconnection of the electric fuse, varies due to manufacturing fluctuations, a film thickness of the third interconnect also varies correspondingly to the film thickness of the first interconnect, because the third interconnect and the first interconnect are formed in the same layer. In this structure, the first interconnect and the third interconnect are arranged on the one end side and the another end side of the electric fuse, respectively. Therefore, even in a case where fluctuations in film thickness change a resistance of the first interconnect, a resistance of the third interconnect is also changed. Accordingly, change in resistance distribution of the electric fuse is mitigated. As a result, even when the fluctuations in film thickness occur, a temperature may become the highest near a connection point of the first interconnect with the first via portion as originally designed. In this way, the flowing-out portion may be formed at a constant position, and the electric fuse may be stably disconnected.

It should be noted that any combination of the above-mentioned structural components and a replaced expression of the present invention, for example, between a method and a device are to be considered also as aspects of the present invention.

According to the present invention, there may be obtained an electric fuse having a structure in which the disconnection point may be controlled irrespective of the manufacturing fluctuations.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Hereinafter, an embodiment of the present invention is described with reference to the accompanying drawings. It should be noted that, throughout all the drawings, similar structural components are denoted by similar reference symbols and description thereof is appropriately omitted.

Figure 1:
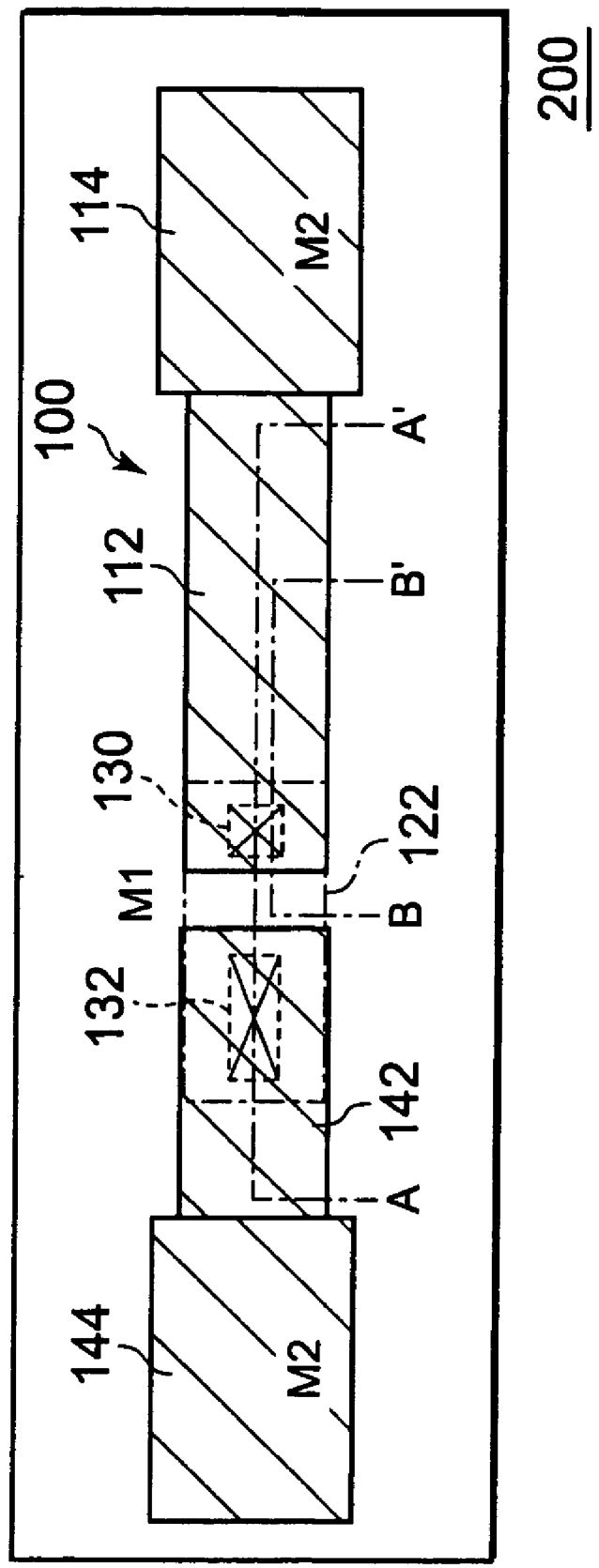
FIG. 1 is a plan view illustrating an example of a structure of a semiconductor device according to an embodiment of the present invention.
Figure 2A:
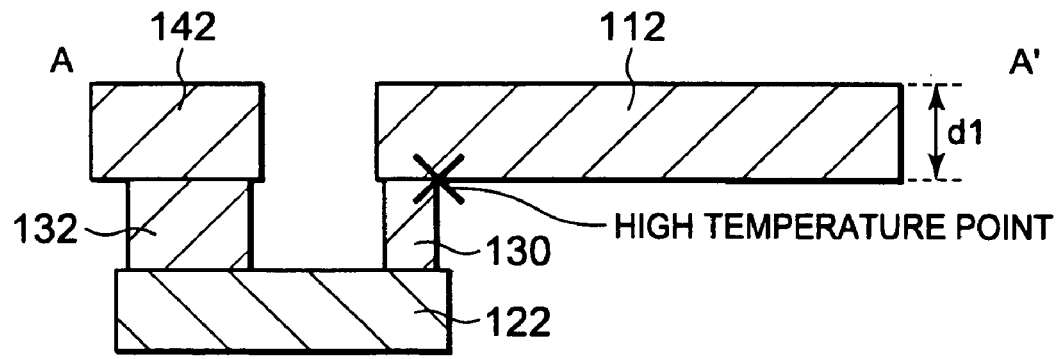
FIGS. 2A to 2C are cross-sectional views taken along the line A-A' of FIG. 1.
Figure 2B:
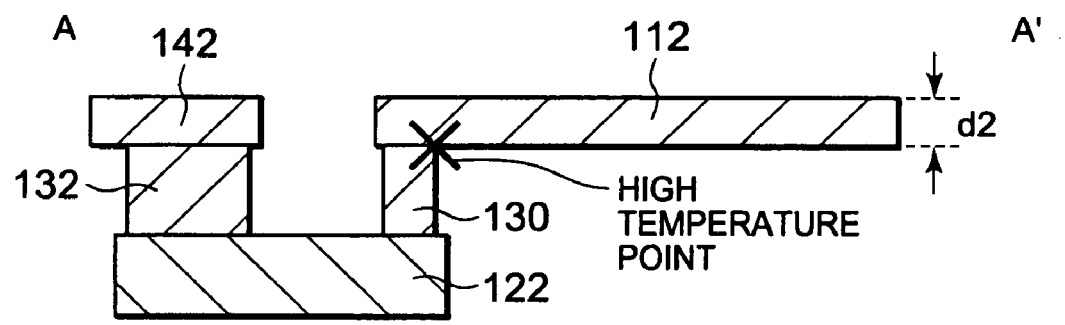
Figure 2C:
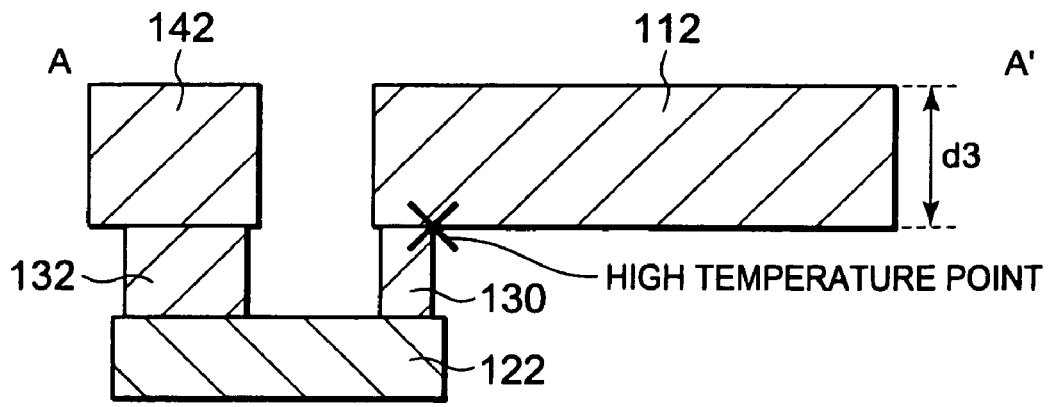

FIG. 1 is a plan view illustrating an example of a structure of a semiconductor device according to this embodiment. FIGS. 2A to 2C are cross-sectional views taken along the line A-A' of FIG. 1. FIGS. 3A to 3C and 4A to 4C are cross-sectional views taken along the line B-B' of FIG. 1.

A semiconductor device 200 includes a substrate (not shown) that is a semiconductor substrate such as a silicon substrate, and an electric fuse 100 formed on the substrate.

The electric fuse 100 includes: a first interconnect 112; a second interconnect 122 formed in a layer different from a layer in which the first interconnect 112 is formed; a first via 130 (first via portion) provided in contact with one end of the first interconnect 112 and one end of the second interconnect 122 to connect the first interconnect 112 and the second interconnect 122; a third interconnect 142 formed in the same layer in which the first interconnect 112 is formed; and a second via 132 (second via portion) provided in contact with one end of the third interconnect 142 and another end of the second interconnect 122 to connect the third interconnect 142 and the second interconnect 122.

In the structure of this embodiment, a resistance at the connection between the third interconnect 142 and the second interconnect 122 by the via maybe made lower than a resistance at the connection between the first interconnect 112 and the second interconnect 122 by the via. A resistance of the second via 132 is made lower than a resistance of the first via 130. For example, the second via 132 maybe formed such that a contact area between the second via 132 and the second interconnect 122 is larger than a contact area between the first via 130 and the second interconnect 122. For example, the second via 132 may be formed to be thicker than the first via 130. For example, the second via 132 may be formed of a slit via.

Further, as another example, the third interconnect 142 and the second interconnect 122 maybe connected by a plurality of vias, with the result that the resistance at the connection between the third interconnect 142 and the second interconnect 122 by the vias may be made lower than the resistance at the connection between the first interconnect 112 and the second interconnect 122. In a case where the respective vias are formed of the same material, the contact area of the via (second via 132), which connects the third interconnect 142 and the second interconnect 122, with the second interconnect 122 maybe made, for example, equal to or larger than twice the contact area of the via (first via 130), which connects the first interconnect 112 and the second interconnect 122, with the second interconnect 122.

The semiconductor device 200 further includes: a first terminal 114 that is formed above the substrate, at least in the same layer in which the first interconnect 112 is formed and is connected to another end of the first interconnect 112; and a second terminal 144 that is formed above the substrate, at least in the same layer in which the third interconnect 142 is formed and is connected to another end of the third interconnect 142.

In this embodiment, the electric fuse 100 is disconnected by a crack assist type method. Specifically, a conductive material that forms the electric fuse 100 flows out from the first interconnect 112 outwardly during the disconnection, to thereby form a flowing-out portion. The electric fuse 100 may be disconnected by the flowing-out portion thus formed. In this embodiment, a disconnection point may be formed in the first via 130.

In the case where the electric fuse 100 is disconnected by the crack assist type method, Joule heat generated by a current controls the disconnection. Therefore, in order to prevent an interconnect from being inappropriately disconnected at a point other than a point desired to be disconnected, the electric fuse 100 is required to have a structure in which heat is not generated in the first terminal 114 and the second terminal 144 except for the point desired to be disconnected even under application of a large current. The first terminal 114 and the second terminal 144 may be, for example, a common interconnect or a pad interconnect for applying a voltage to the electric fuse. Alternatively, the first terminal 114 and the second terminal 144 may be an extraction interconnect connected to the common interconnect or the pad interconnect. In any case, a width of the first terminal 114 and a width of the second terminal 144 in a direction orthogonal to a direction in which a current flows in the electric fuse 100 (hereinafter, simply referred to as interconnect width) maybe equal to or larger than a widest portion of the first interconnect 112 and a widest portion of the second interconnect 122. Further, the first terminal 114 and the second terminal 144 may be structured so as not to affect a position or the like of the disconnection point during the disconnection of the electric fuse 100.

When a predetermined voltage is applied between the first terminal 114 and the second terminal 144 in the electric fuse 100, more heat is generated in a portion between the first terminal 114 and the second terminal 144, the portion being higher in resistance. Further, the first terminal 114 and the second terminal 144, each having a wide interconnect width, function as heat sinks for dissipating the heat necessary for disconnecting the electric fuse 100. Therefore, a point at which the temperature becomes the highest during the disconnection of the electric fuse 100 is somewhere around the portion having a large heat generation amount, which is away from the first terminal 114 and the second terminal 144. Further, in disconnecting the electric fuse 100, a position at which the flowing-out portion is formed may vary, depending on areas or the like of the respective structural components.

In this embodiment, the second via 132 is formed so as to have a lower resistance than that of the first via 130. Therefore, more heat is generated near the first via 130 having a higher resistance. Further, in order to increase a distance from the first terminal 114 to the second via 132, the first interconnect 112 maybe made longer than the third interconnect 142. Accordingly, the first interconnect 112 expands as the temperature thereof rises to be higher than those of the third interconnect 142 and the second interconnect 122. As a result, control may be performed such that the conductive material flows out from the first interconnect 112.

Further, in this embodiment, the third interconnect 142 is formed in the same layer in which the first interconnect 112 is formed. Therefore, when the film thickness of the first interconnect 112 varies, the film thickness of the third interconnect 142 also varies correspondingly. Hereinafter, a description is given with reference to FIGS. 2A to 2C.

First, in order to form the flowing-out portion in the first interconnect 112 and to form the disconnection point in the first via 130, the respective widths and lengths of the first interconnect 112, the first via 130, the second interconnect 122, the second via 132, and the third interconnect 142 are appropriately adjusted so that the temperature becomes the highest near a connection point of the first interconnect 112 with the first via 130 (FIG. 2A).

There may be a case, for example, as illustrated in FIG. 2B, in which the film thickness of the first interconnect 112 reduces from a preset value d1 of FIG. 2A to a value d2 of FIG. 2B (d1>d2). In this case, the resistance of the first interconnect 112 changes to become higher. However, in this embodiment, the film thickness of the third interconnect 142 formed in the same layer in which the first interconnect 112 is formed also reduces correspondingly to the film thickness of the first interconnect 112, from the preset value d1 to the value d2, and hence the resistance of the third interconnect 142 also increases. Therefore, change in resistance distribution between the first terminal 114 and the second terminal 144 is mitigated. As a result, even when fluctuations in film thickness occur, the temperature may become the highest near the connection point of the first interconnect 112 with the first via 130 as originally designed.

Similarly, there may be another case, for example, as illustrated in FIG. 2C, in which the film thickness of the first interconnect 112 increases from the preset value d1 of FIG. 2A to a value d3 of FIG. 2C (d3>d1). In this case, the resistance of the first interconnect 112 changes to become lower. However, in this embodiment, the film thickness of the third interconnect 142 formed in the same layer in which the first interconnect 112 is formed also increases from the preset value d1 to the value d3, and hence the resistance of the third interconnect 142 also reduces. Therefore, change in resistance distribution between the first terminal 114 and the second terminal 144 is mitigated. As a result, even when the fluctuations in film thickness occur, the temperature may become the highest near the connection point of the first interconnect 112 with the first via 130 as originally designed.

Next, a procedure of disconnecting the electric fuse 100 in this embodiment is described.

Figure 3A:
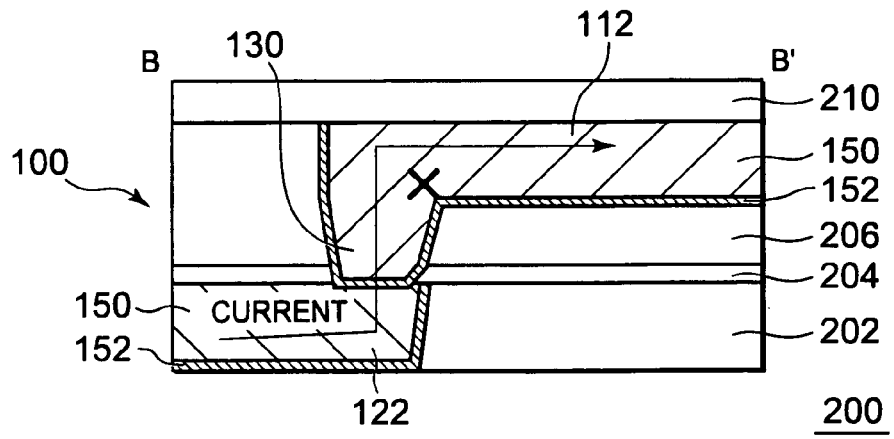
FIGS. 3A to 3C are cross-sectional views taken along the line B-B' of FIG. 1.
Figure 3B:
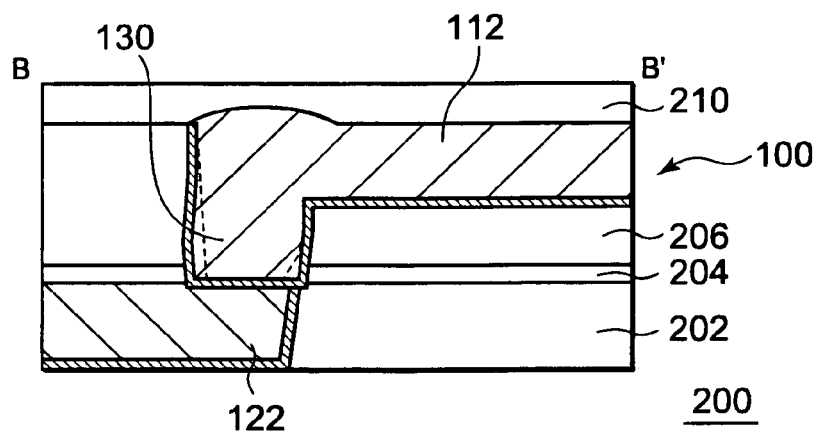
Figure 3C:
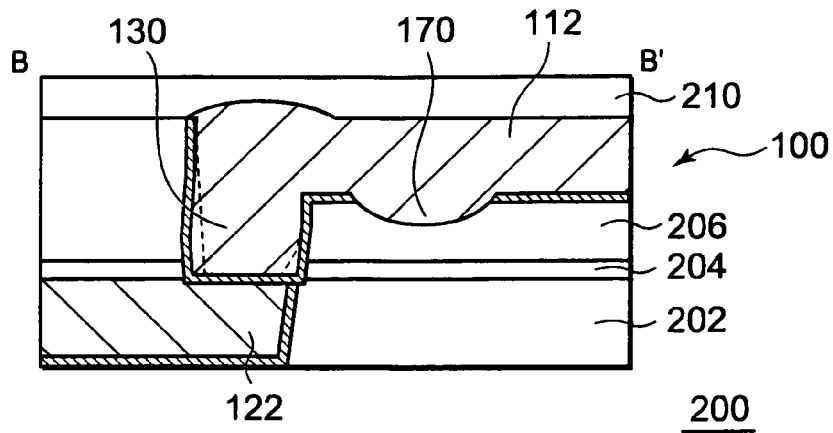

As illustrated in FIGS. 3A to 3C, in this embodiment, the semiconductor device 200 has a structure in which an interlayer insulating film 202, an etching stopper film 204, an interlayer insulating film 206, and an interlayer insulating film 210 are laminated on the substrate (not shown) in the stated order. FIG. 3A illustrates a state before the disconnection.

The second interconnect 122 is formed in the interlayer insulating film 202. The first via 130 is formed in the etching stopper film 204 and the interlayer insulating film 206. The first interconnect 112 is formed in the interlayer insulating film 206. Further, the first via 130 and the first interconnect 112 may be formed by a dual damascene process or a single damascene process. Though not illustrated in FIGS. 3A to 3C, the second via 132 is also formed in the etching stopper film 204 and the interlayer insulating film 206. The third interconnect 142 is also formed in the interlayer insulating film 206. Further, the second via 132 and the third interconnect 142 may be formed by a dual damascene process or a single damascene process, similarly to the first via 130 and the first interconnect 112.

It should be noted that all layers are not necessarily illustrated in FIGS. 3A to 3C and that a protective film or an etching stopper film may be formed between the respective layers as appropriate. Further, the first via 130 and the first interconnect 112 may be formed in layers of different interlayer insulating films. The interlayer insulating films each may be formed of, for example, a low-dielectric film such as a porous organic film. The etching stopper film may be formed of, for example, silicon oxycarbide (SiOC).

The first terminal 114, the first interconnect 112, the first via 130, the second interconnect 122, the second via 132, the third interconnect 142, and the second terminal 144 may be each formed of a copper-containing metal film 150. Further, a barrier metal film 152 may be formed on a side surface and a bottom surface of the copper-containing metal film 150 that forms each of the first terminal 114, the first interconnect 112, the first via 130, the second interconnect 122, the second via 132, the third interconnect 142, and the second terminal 144. The barrier metal film 152 may contain a high-melting-point metal. The barrier metal film 152 may be formed of, for example, a tantalum (Ta) film, a tantalum nitride (TaN) film, a titanium (Ti) film, a titanium nitride (TiN) film, a tungsten (W) film, a tungsten nitride (WN) film, or the like.

Specifically, in the state before the disconnection, the barrier metal film 152 is formed between the second interconnect 122 and the first via 130 in contact with the copper-containing metal film 150 that forms each of the second interconnect 122 and the first via 130.

In the electric fuse 100 having the above-mentioned structure, a voltage is applied between the first terminal 114 and the second terminal 144, to thereby apply an appropriate power to the electric fuse 100. Though not particularly limited, for example, a high voltage (Vdd) is applied to the second terminal 144, and the first terminal 114 is grounded, to thereby apply an appropriate power to the electric fuse 100. As a result, a current is caused to flow in a direction from the third interconnect 142 to the first interconnect 112 through the second interconnect 122 (FIG. 3A). Accordingly, the conductive material that forms the electric fuse 100 is heated and expands.

In this case, as described with reference to FIGS. 2A to 2C, the temperature becomes the highest near the connection point of the first interconnect 112 with the first via 130. The volume of the copper-containing metal film 150 formed of the conductive material is largely increased in a part in which the temperature becomes higher (high temperature point). In this embodiment, the copper-containing metal film 150, which forms each of the first via 130 and the first interconnect 112, expands near the high temperature point. A via diameter of the first via 130 expands to be larger than an original via diameter thereof. Further, in an upper part of the first interconnect 112, silicon, carbon, or the like which is contained in the interlayer insulating film 210 is brought into contact with the conductive material having a high temperature to be taken into the conductive material (FIG. 3B). After that, when the expansion of the first interconnect 112 advances to a certain degree, a crack occurs in the interlayer insulating film 206 located around the first interconnect 112 having a large volume. As a result, the copper-containing metal film 150 flows into the interlayer insulating film 206, to thereby form a flowing-out portion 170 (FIG. 3C).

Figure 4A:
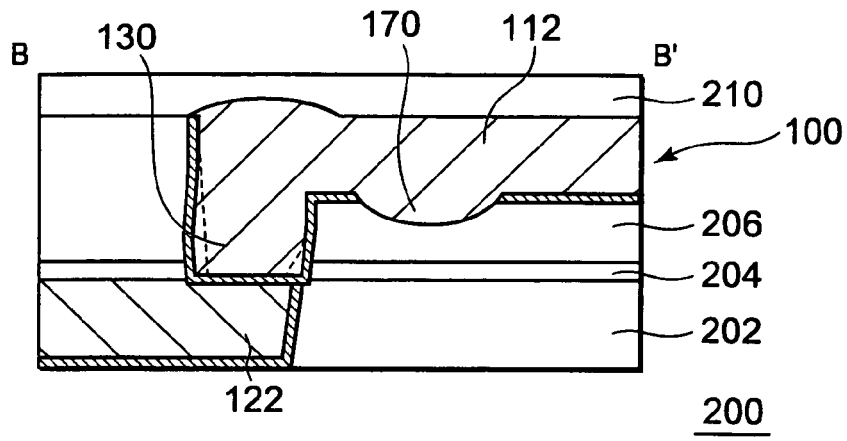
FIGS. 4A to 4C are cross-sectional views taken along the line B-B' of FIG. 1.
Figure 4B:
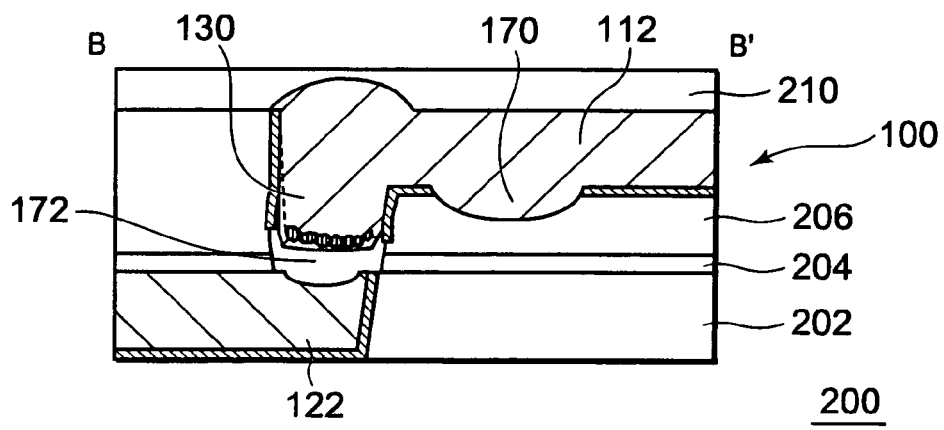
Figure 4C:
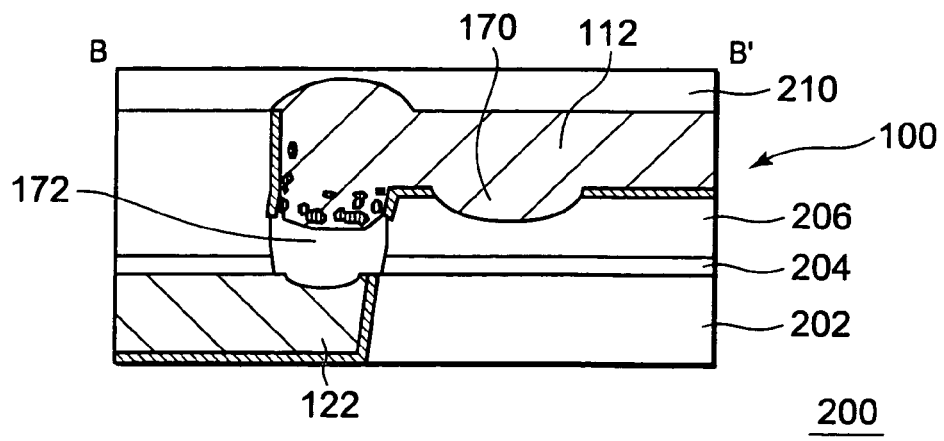
Figure 5:
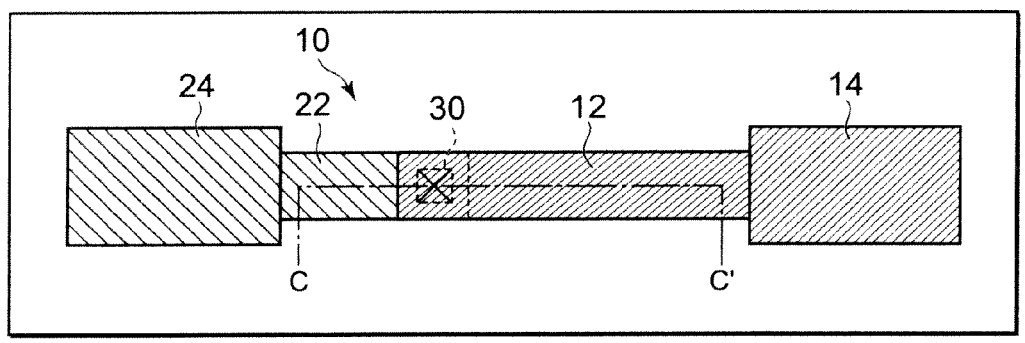
FIG. 5 is a plan view illustrating a structure of a semiconductor device according to a related art.
Figure 6A:
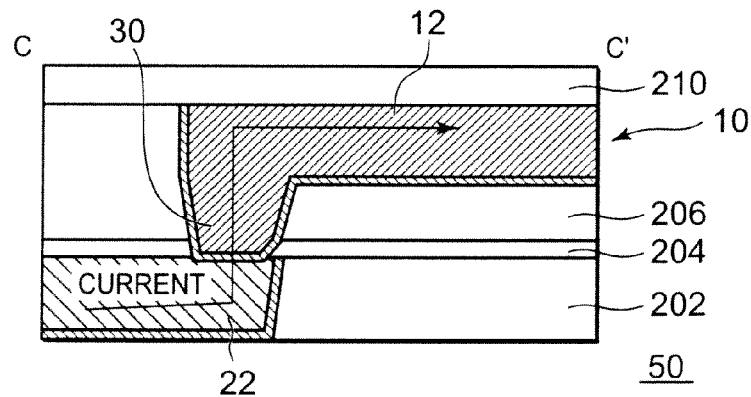
FIGS. 6A to 6C are cross-sectional views taken along the line C-C' of FIG. 5.
Figure 6B:
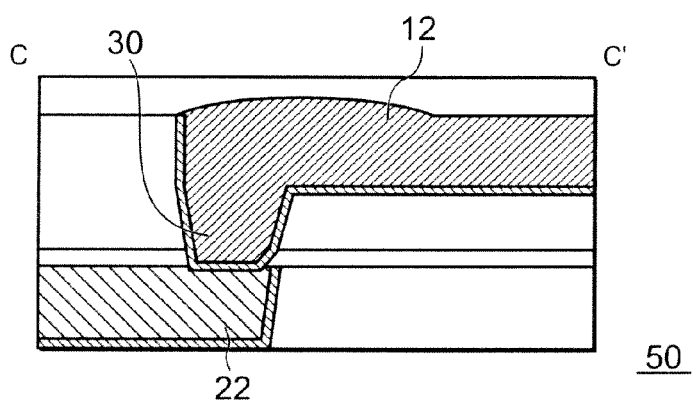
Figure 6C:
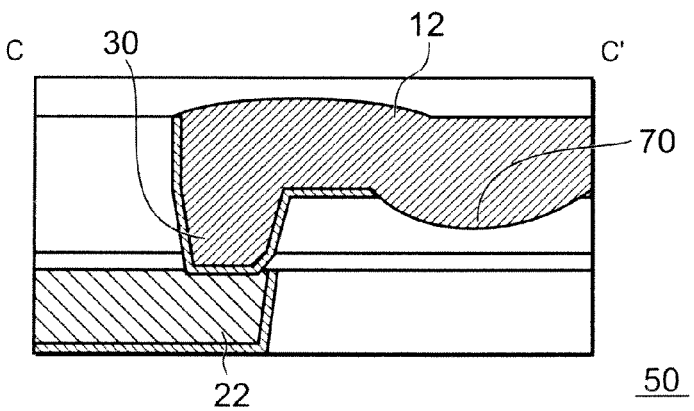
Figure 7A:
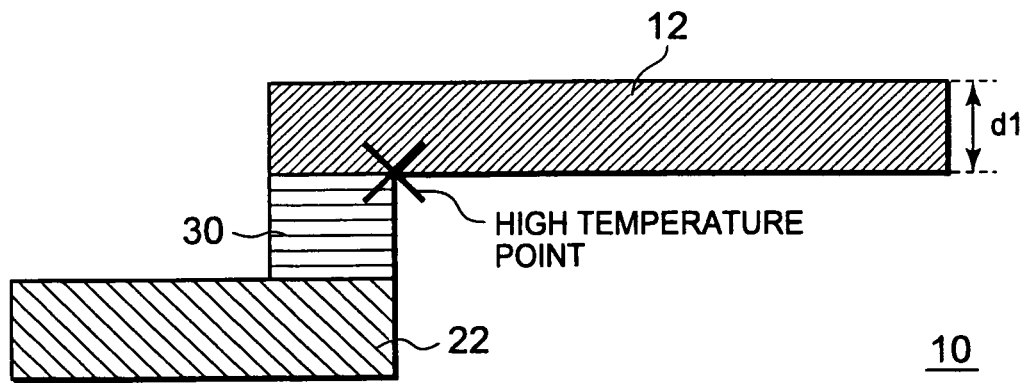
FIGS. 7A to 7C are views for describing a problem of the related art.
Figure 7B:
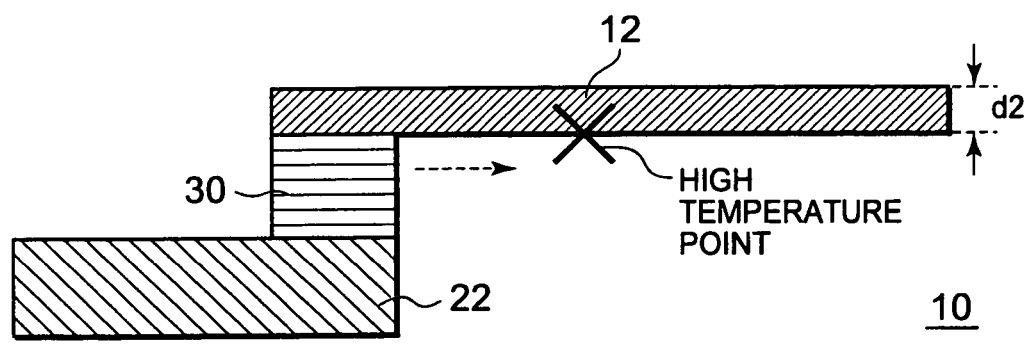
Figure 7C:
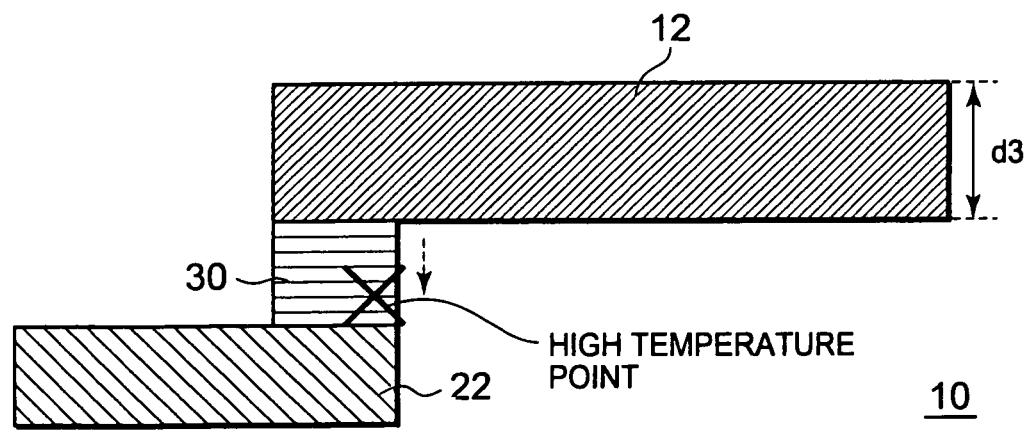
Figure 8A:
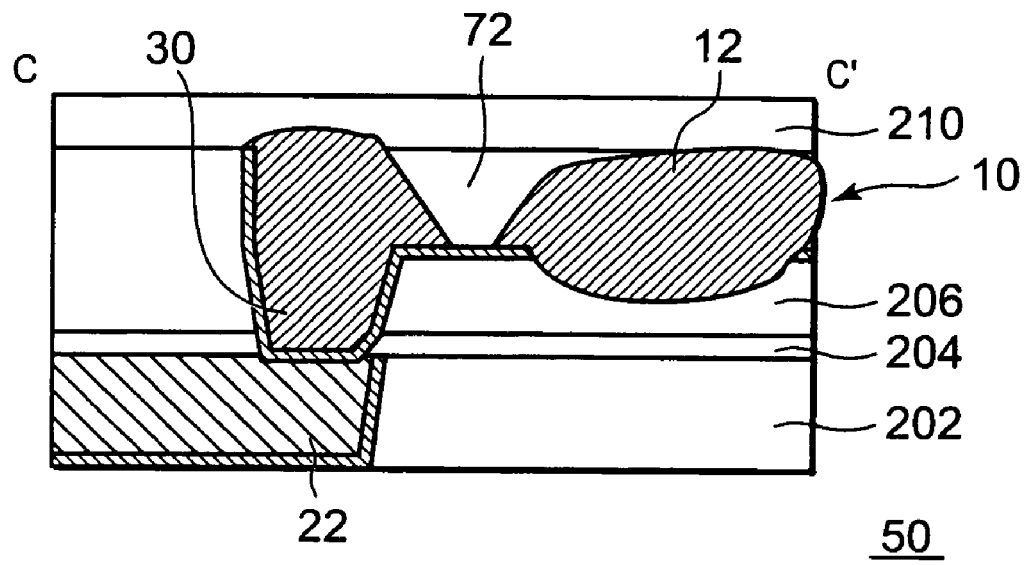
FIGS. 8A and 8B are views for describing another problem of the related art.
Figure 8B:
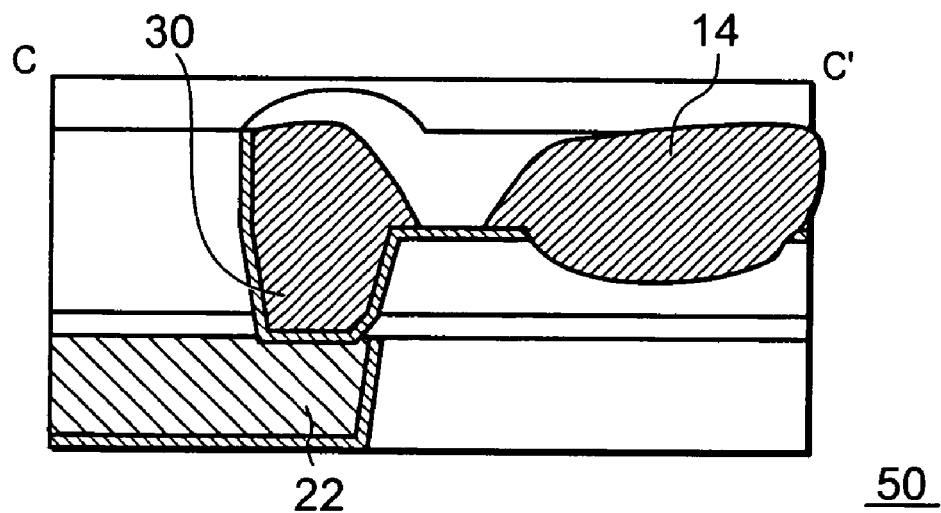

After that, the conductive material is melted with a lapse of time to increase a resistance thereof. As a result, heat supply reduces, and the copper-containing metal film 150 starts to solidify (FIG. 4A). In this case, the copper-containing metal film 150 thermally contracts, and moves such that a surface area thereof becomes smaller due to a surface tension. Then, a void is generated in the first via 130 to form a disconnection point 172 (FIG. 4B). After that, the copper-containing metal film 150 continues to thermally contract until the temperature thereof reaches room temperature, and then solidifies while leaving the disconnection point 172 between the first via 130 and the second interconnect 122 (FIG. 4C).

In this embodiment, the first interconnect 112 and the second interconnect 122 may be formed so as not to overlap each other in plan view except for a region connected to the first via 130. Accordingly, when the flowing-out portion 170 is formed, the first interconnect 112 and the second interconnect 122 may be prevented from being connected to each other through the flowing-out portion 170. It should be noted that, for a reliable connection with the first via 130, the first interconnect 112 and the second interconnect 122 may be formed wider than the via diameter of the first via 130 in plan view, and formed so as to extend in an eaves-like shape from the first via 130. The "region connected to the first via 130" described herein includes such a region as described above.

Further, in this embodiment, the barrier metal film 152 is formed between the first via 130 and the second interconnect 122. Therefore, the barrier metal film 152 is easily separated from the second interconnect 122, and the disconnection point 172 is formed with ease between the barrier metal film 152 and the second interconnect 122. In addition, in the disconnection state, the copper-containing metal film 150 that forms the first via 130 moves along with the barrier metal film 152, with the result that the disconnection point 172 is formed between the barrier metal film 152 and the second interconnect 122. Therefore, it may be prevented that the conductive materials that form the barrier metal film and the copper-containing metal film coagulate and then deform due to thermal history thereof in the following assembly process or the like or in actual use under high temperature so that the second interconnect 122 and the first via 130 are reconnected to each other. Accordingly, heat resistance of the semiconductor device 200 may be enhanced.

The electric fuse 100 is disconnected by the crack assist type method having the mechanism as described above. As a result, the disconnection point 172 is consequently formed in a region different from a region in which the flowing-out portion 170 is formed. Accordingly, the reconnection of the electric fuse 100 may be prevented.

Next, an effect of the semiconductor device 200 of this embodiment is described.

According to the electric fuse 100 described above, even when the film thickness of the first interconnect 112, which is designed such that the flowing-out portion 170 is formed during the disconnection of the electric fuse 100, varies due to manufacturing fluctuations, the film thickness of the third interconnect 142 also varies correspondingly to the film thickness of the first interconnect 112, because the third interconnect 142 is formed in the same layer in which the first interconnect 112 is formed. In this embodiment, the first interconnect 112 and the third interconnect 142 are arranged substantially at both ends of the electric fuse 100 across the first via 130, the second interconnect 122, and the second via 132 sandwiched therebetween. Therefore, even in the case where the fluctuations in film thickness change the resistance of the first interconnect 112, the resistance of the third interconnect 142 is similarly changed. Accordingly, the change in resistance distribution between the first terminal 114 and the second terminal 144 is mitigated. As a result, even when the fluctuations in film thickness occur, the temperature may become the highest near the connection point of the first interconnect 112 with the first via 130 as originally designed. In this way, the flowing-out portion 170 may be formed at a constant position, and the electric fuse 100 may be stably disconnected.

Hereinabove, the embodiment of the present invention is described with reference to the accompanying drawings. The above-mentioned structures are merely examples of the present invention, and thus various structures different from the above may be adopted.

The embodiment described above employs the structure in which the first interconnect 112 and the third interconnect 142 are formed in a layer above the layer in which the second interconnect 122 is formed. Alternatively, there may be employed a structure in which the first interconnect 112 and the third interconnect 142 are formed in a layer below the layer in which the second interconnect 122 is formed.

What is claimed is:

1. A semiconductor device, comprising:
    a substrate; and
    an electric fuse formed on the substrate, the electric fuse including:
        a first interconnect formed on one end side of the electric fuse;
        a second interconnect formed in a layer different from a layer in which the first interconnect is formed;
        a first via portion provided in contact with the first interconnect and the second interconnect to connect the first interconnect and the second interconnect;
        a third interconnect formed on another end side of the electric fuse, the third interconnect being formed in the same layer in which the first interconnect is formed, as being separated from the first interconnect; and
        a second via portion provided in contact with the third interconnect and the second interconnect to connect the third interconnect and the second interconnect, the second via portion being lower in resistance than the first via portion,
    wherein the electric fuse is disconnected by a flowing-out portion at the first interconnect that comprises a conductive material forming the electric fuse which flows outwardly during disconnection,
    wherein each of the first interconnect, the second interconnect, the third interconnect, the first via portion, and the second via portion comprises a copper-containing metal, and
    wherein the electric fuse is disconnected without cutting the second interconnect,
    wherein the second via portion has a contact area with the second interconnect, which is larger than a contact area of the first via portion with the second interconnect,
    wherein the second via portion comprises a single via, and
    wherein, in a plan view, a length of the second interconnect in a first direction is substantially a same as a length of the first interconnect in the first direction at an overlap portion between the first and second interconnects, wherein a width of the overlap portion between the first and second interconnects in a second direction perpendicular to the first direction is smaller than a width of an overlap portion between the second and third interconnects in the second direction, wherein an entire non-overlap portion of the second interconnect which is not overlapped by the first and third interconnects is in a rectangular shape, wherein each of the first and second via portions is a single via, and a width of the second via portion is greater than a width of the first via portion.

2. The semiconductor device according to claim 1, wherein the flowing-out portion is formed in the electric fuse when the conductive material forming the electric fuse flows outwardly from the first interconnect during the disconnection.

3. The semiconductor device according to claim 2, wherein the electric fuse is disconnected by a disconnection point formed at the first via portion.

4. A semiconductor device according to claim 1, wherein the first interconnect is formed in a layer above a layer in which the second interconnect is formed,
    a barrier metal film that covers a side surface and a bottom surface of the copper-containing metal of both the first interconnect and the first via portion, and
    wherein the barrier metal film is formed, before the disconnection, between the second interconnect and the first via portion, in contact with the copper-containing metal that forms each of the second interconnect and the first via portion.

5. A semiconductor device according to claim 1, further comprising:
    an insulating film disposed on the substrate; and
    a barrier metal film disposed on the insulating film and abutting the copper-containing metal,
    wherein the flowing-out portion protrudes into the insulating film.

6. A semiconductor device according to claim 5, wherein, during the disconnection, the conductive material flows into the insulating film to form the flowing-out portion.

7. A semiconductor device according to claim 1, further comprising:
    an insulating film disposed on the substrate,
    wherein the flowing-out portion protrudes into the insulating film, and
    wherein, during the disconnection, the conductive material flows into the insulating film to form the flowing-out portion.

8. A semiconductor device according to claim 1, wherein the flowing-out portion flows outwardly from a bottom surface of the first interconnect during said disconnection.

9. A semiconductor device according to claim 1, wherein a length of the first interconnect is more than a length of the third interconnect.

10. A semiconductor device according to claim 1, wherein the first interconnect expands as a temperature thereof rises such that the conductive material flows out from the first interconnect as a result of a length of the first interconnect being more than a length of the third interconnect.

11. A semiconductor device according to claim 1, further comprising:
    a barrier metal film disposed on a bottom surface of the first interconnect,
    wherein the flowing-out portion protrudes outward from the barrier metal film.

12. A semiconductor device according to claim 11, wherein during said disconnection, a first portion of the barrier metal film is disconnected from a second portion of the barrier metal film.

13. A semiconductor device according to claim 1, wherein a void between the first via portion and the second interconnect disconnects the electric fuse during said disconnection.

* * * * *